(12) United States Patent
Sohn et al.

(10) Patent No.: US 7,911,127 B2
(45) Date of Patent: Mar. 22, 2011

(54) PHOSPHOR BLEND FOR WAVELENGTH CONVERSION AND WHITE LIGHT EMITTING DEVICE USING THE SAME

(75) Inventors: Jong Rak Sohn, Kyungki-do (KR); Il Woo Park, Kyungki-do (KR); Yun Seup Chung, Seoul (KR); Chang Hoon Kwak, Seoul (KR); Chul Soo Yoon, Kyungki-do (KR); Joon Ho Yoon, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 358 days.

(21) Appl. No.: 11/320,137

(22) Filed: Dec. 28, 2005

(65) Prior Publication Data

US 2006/0221635 A1  Oct. 5, 2006

(30) Foreign Application Priority Data

Mar. 30, 2005 (KR) .................. 10-2005-0026708

(51) Int. Cl.
*H01J 1/62* (2006.01)
(52) U.S. Cl. ...................... 313/503; 313/502
(58) Field of Classification Search .................. 313/498, 313/501–506; 252/301.4 P, 301.4 S, 301.4 F, 252/301.4 H
See application file for complete search history.

(56) References Cited

U.S. PATENT DOCUMENTS

| 4,079,287 | A | * | 3/1978 | Soules et al. ................. 313/487 |
| 4,423,349 | A | * | 12/1983 | Nakajima et al. ............. 313/487 |
| 6,809,781 | B2 | | 10/2004 | Setlur et al. |
| 2003/0155856 | A1 | | 8/2003 | Shiiki et al. |
| 2004/0000862 | A1 | | 1/2004 | Setlur et al. |
| 2004/0169456 | A1 | * | 9/2004 | Scholl et al. ................. 313/485 |
| 2004/0245532 | A1 | | 12/2004 | Maeda et al. |
| 2005/0156496 | A1 | * | 7/2005 | Takashima et al. ........... 313/237 |
| 2005/0200271 | A1 | | 9/2005 | Juestel et al. |
| 2005/0230689 | A1 | * | 10/2005 | Setlur et al. ................... 257/79 |
| 2006/0093852 | A1 | * | 5/2006 | Marsitzky et al. ............ 428/690 |
| 2007/0176194 | A1 | * | 8/2007 | Wakamatsu et al. ............ 257/98 |

FOREIGN PATENT DOCUMENTS

| CN | 1495486 A | 5/2004 |
| JP | 2003110150 A | 4/2003 |
| JP | 2004107623 A | 4/2004 |
| KR | 2003-60280 | 7/2003 |
| KR | 2003-69010 | 8/2003 |
| KR | 1020040076300 A | 9/2004 |
| TW | 518773 A1 | 1/2003 |
| TW | 200307738 A | 12/2003 |
| WO | 03032407 A1 | 4/2003 |

* cited by examiner

*Primary Examiner* — Joseph L Williams
*Assistant Examiner* — Fatima N Farokhrooz
(74) *Attorney, Agent, or Firm* — Volpe and Koenig P.C.

(57) ABSTRACT

The present invention relates to phosphor blend for wavelength conversion and a white light emitting device using the same. The phosphor blend of the invention comprises three phosphors, $A_5(PO_4)_3Cl:Eu^{2+}$, $D_2SiO_4$:Eu and MS:Eu at a composition where near ultraviolet radiation is converted into light positioned at a CIE coordinate (x, y), where $0.25 \leq x \leq 0.45$ and $0.25 \leq y \leq 0.43$, wherein A comprises at least one of Sr, Ca, Ba, and Mg, D comprises at least one of Ba, Sr, and Ca, and M comprises at least one of Sr and Ca. Furthermore, the present invention provides a new white light emitting device in combination of the phosphor blend and a near ultraviolet LED.

7 Claims, 5 Drawing Sheets

PHOSPHOR BLEND FOR WAVELENGTH CONVERSION AND WHITE LIGHT EMITTING DEVICE USING THE SAME

CLAIM OF PRIORITY

This application claims the benefit of Korean Patent Application No. 2005-26708 filed on Mar. 30, 2005, in the Korean Intellectual Property Office, the disclosure of which is incorporated herein by reference.

BACKGROUND OF THE INVENTION

1. Field of the Invention

The present invention relates to phosphor blend for wavelength conversion, and more particularly, to phosphor blend for wavelength conversion capable of expressing a variety of colors, and further having a superior Color Rendering Index (CRI), which enables provision of white light that is close to natural light, and a white light emitting device using the same.

2. Description of the Related Art

In general, a phosphor for wavelength conversion is used for converting a specific wavelength light of diverse light sources into a desired wavelength light. Among the diverse light sources, since the LED is useful for LCD backlights, and for automobile and home illumination because of its low-power driving and superior light efficiency, the phosphor has become popular these days as technology essential in the manufacture of white light LEDs.

A white light emitting device is manufactured by applying a yellow phosphor on a blue LED. More specifically, a yellow phosphor YAG ($Y_3Al_5O_{12}$):Ce is applied on a light emission surface of a blue LED having a GaN/InGaN active layer to convert parts of blue light into yellow light, and the converted yellow light and other parts of blue light are combined to provide white light.

The conventional white light emitting device composed of a YAG:Ce phosphor (or TAG-based phosphor) and a blue LED has a drawback of low color rendering quality. That is, the wavelength of white light obtained using the yellow phosphor is distributed only in blue and yellow regions, and its color rendering quality is low, and therefore, it is limited in realizing desired all-natural white light. In addition, if the operating temperature rises due to long use, the problematic yellowing occurs.

The conventional phosphor for wavelength conversion is limited only to provision of light emission colors of a specific light source and colors of specific output light, and also limited in achievable color distribution. Thus there are limitations in applying the conventional phosphor to light emission colors of diverse light sources and/or colors of diverse kinds of output light depending on the user's needs.

In order to reduce such problems, the assignee of this invention has previously proposed phosphor blend composed of blue, green, and red in Korean Patent Application No. 2004-0076300 (filed on Sep. 23, 2004).

As described above, there has been a need for phosphor blend which can mitigate yellowing and has superior Color Rendering Index at the same time, and further can achieve a broader color distribution in the art.

SUMMARY OF THE INVENTION

The present invention has been made to solve the foregoing problems of the prior art and it is therefore an object of the present invention to provide a phosphor blend for wavelength conversion combined by phosphors to enable expression of diverse colors.

It is another object of the invention to provide a white light emitting phosphor blend combined with blue, yellow, and red phosphors applied to near ultraviolet rays to provide white light in which yellowing is mitigated and Color Rendering Index is superior.

It is yet another of the invention to provide a superior quality white light emitting device applied with the white light emitting phosphor blend.

According to a first aspect of the invention for realizing the object, there is provided a Phosphor blend for wavelength conversion comprising three phosphors, $A_5(PO_4)_3Cl:Eu^{2+}$, $D_2SiO_4:Eu$, and MS:Eu, wherein A comprises at least one of Sr, Ca, Ba, and Mg, D comprises at least one of Ba, Sr, and Ca, and M comprises at least one of Sr and Ca.

According to a second aspect of the invention, there is provided a white light emitting phosphor blend comprising three phosphors, $A_5(PO_4)_3Cl:Eu^{2+}$, $D_2SiO_4:Eu$, and MS:Eu at a composition where near ultraviolet radiation is converted into light positioned at a CIE coordinate (x, y), where $0.25 \leq x \leq 0.45$ and $0.25 \leq y \leq 0.43$, wherein A comprises at least one of Sr, Ca, Ba, and Mg, D comprises at least one of Ba, Sr, and Ca, and M comprises at least one of Sr and Ca.

According to a third aspect of the invention, there is a provided a A white light emitting device comprising: a light emitting diode (LED) for emitting near ultraviolet radiation; and a wavelength converting part placed in the light emission direction of the LED, and having white light emitting phosphor blend and curing resin wherein the white light emitting phosphor comprises three phosphors, $A_5(PO_4)_3Cl:Eu^{2+}$, $D_2SiO_4:Eu$, and MS:Eu, at a composition where near ultraviolet radiation is converted into light positioned at a CIE coordinate (x, y), where $0.25 \leq x \leq 0.45$ and $0.25 \leq y \leq 0.43$, wherein A comprises at least one from Sr, Ca, Ba and Mg, D comprises Ba, Sr and Ca, and M comprises at least one of Sr and Ca.

Preferably, the near ultraviolet LED emits radiation having a wavelength of 300 to 450 nm. In addition, in a particular embodiment, the curing resin may comprise silicon or epoxy resin.

Preferably, the output light of the white light emitting device has a color rendering index of 80 or more, close to natural light, and more preferably, a color rendering index of 90.

The term "near ultraviolet" refers to a range from 300 to 450 nm, unless indicated otherwise. Also, chromaticity diagram and color rendering index of phosphor or phosphor blend refer to the chromaticity and color rendering index of output light converted by the phosphor or phosphor blend, unless indicated otherwise. In addition, the term "white light emitting phosphor blend" refers to phosphor blend that activate a specific type of light (near ultraviolet light) into white light.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 2:
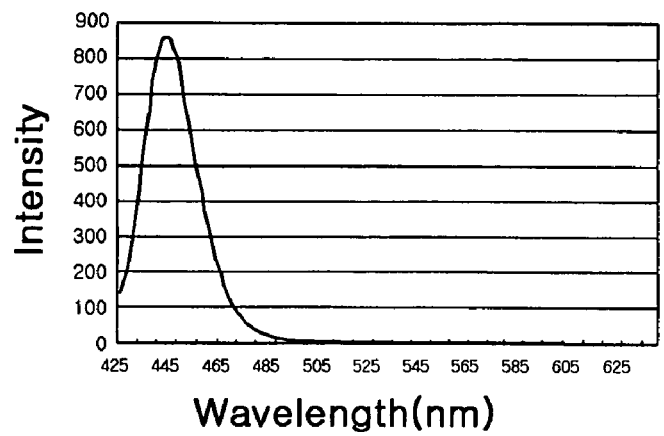
FIGS. 2a to 2c are graphs showing light emission wavelengths of blue, green, and red phosphors with respect to near ultraviolet radiation.
Figure 2:
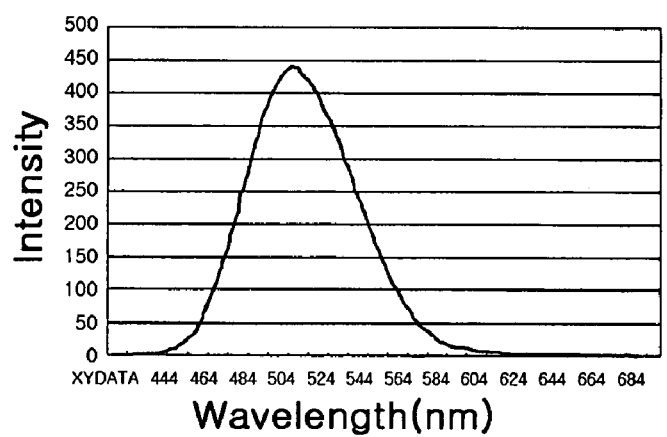
Figure 2:
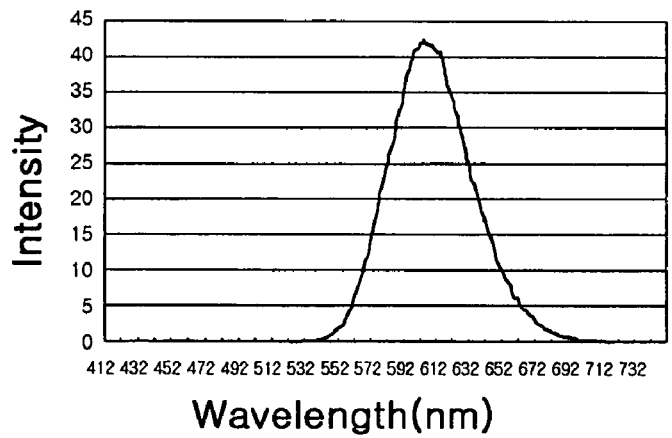

The phosphor for wavelength conversion according to the present invention is obtained by combining red, green and blue phosphors appropriately to enable expression of diverse colors. FIGS. 2a to 2c are graphs showing light emission wavelengths of blue, green, and red phosphors adopted in the present invention.

The blue phosphor used in the present invention is $A_5(PO_4)_3Cl:Eu^{2+}$, where A is at least one of Sr, Ca, Ba, and Mg. The blue phosphor has a peak wavelength of 430 to 460 nm. For example, the peak wavelength of $(Sr, Ca)_5(PO_4)_3Cl:Eu^{2+}$ is about 450 nm as shown in FIG. 2a.

The green phosphor adopted in the present invention is $D_2SiO_4:Eu$, where D is at least one of Ba, Sr, and Ca. The green phosphor has a peak wavelength of 490 to 525 nm. For example, the peak wavelength of $(Ba, Sr)_2SiO_4:Eu$ is about 514 nm as shown in FIG. 2b.

The red phosphor is MS:Eu, where M is at least one of Sr and Ca. The red phosphor has a peak wavelength of 585 to 615 nm. For example, the peak wavelength of (Sr, Ca)S:Eu is about 602 nm as shown in FIG. 2c.

According to a first aspect of the present invention, the blue, green, and red phosphors can be combined to realize a broader chromaticity range.

Figure 3:
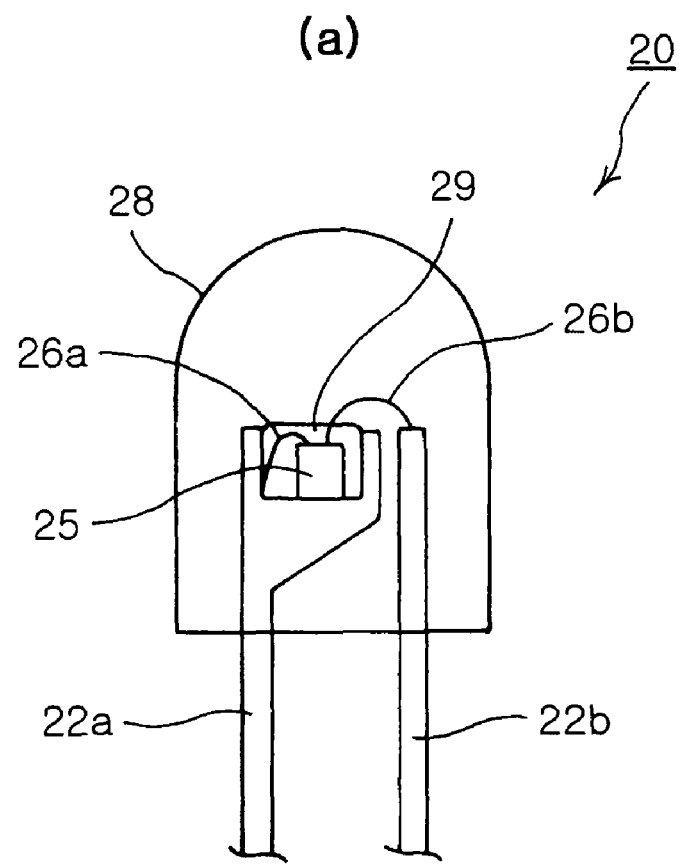
FIGS. 3a and 3b are side sectional views illustrating examples of white light emitting devices according to the present invention.
Figure 3:
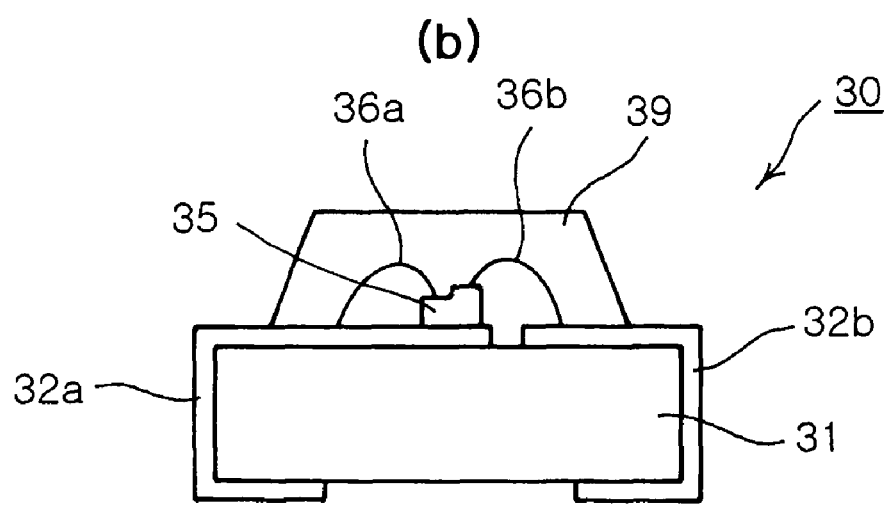

As confirmed in the first embodiment below, in case of using near ultraviolet radiation source, the color range achievable with the phosphor blend of the present invention is positioned within a triangular area having color coordinates (0.15, 0.03), (0.19, 0.63) and (0.62, 0.37) in the CIE chromaticity diagram (refer to FIG. 3).

Such color range was difficult to realize with combination of one or two phosphor materials in the prior art, but the phosphor blend for wavelength conversion according to the present invention is capable of effectively producing a broader color range at an appropriate composition.

In addition, the phosphor blend for wavelength conversion according to the present invention provides white light emitting phosphor blend capable of converting near ultraviolet radiation (about 300 nm to about 450 nm), at a certain composition, into white light having superior characteristics.

The white light emitting phosphor blend can preferably enhance the Color Rendering Index (CRI) of the output light converted from near ultraviolet radiation. The CRI can be increased preferably to 80 or more, more preferably to 90 or more, and most preferably up to 95. In addition, the yellowing phenomenon can be subdued.

In the preferable composition satisfying such level of CRI, $A_5(PO_4)_3Cl:Eu^{2+}$ is contained in an amount of 40 to 88 wt %, $D_2SiO_4:Eu$ is contained in an amount of 10 to 58 wt %, and MS:Eu is contained in an amount of 2 to 50 wt %, and more preferably, $A_5(PO_4)_3Cl:Eu^{2+}$ is contained in an amount of 70 to 83 wt %, $D_2SiO_4:Eu$ is contained in an amount of 13 to 27 wt %, and MS:Eu is contained in an amount of 3 to 7 wt %.

Unlike the combination of a YAG-based phosphor and a blue LED, the white light emitting phosphor blend according to the present invention is provided in combination with a near ultraviolet LED. Also, unlike the conventional phosphor, it can minimize color-changing that can occur with the increase in operation time, such as yellowing.

The above composition is a range that limits white light emitting phosphor blend for a particular phosphor, but depending on the difference in manufacturing process or composition range, there may be relatively large differences in efficiency (±100%), and also, depending on the package structure, the composition range can actually vary.

The improvement effect due to the appropriate composition and CRI will be explained in detail hereunder in a second embodiment.

According to a third aspect of the present invention, the white light emitting phosphor blend and a near ultraviolet LED can be combined to provide a white light emitting device that can be used as a superior illumination device. The white light emitting device can be realized in diverse forms, with examples shown in FIGS. 2a and 2b.

The white light emitting device 20 shown in FIG. 3a may include a package 28 and two lead frames 22a and 22b. The lead frame on one side has an end which forms a cup-shaped structure having a near ultraviolet LED 25 inserted therein. Two electrodes (not shown) of the near ultraviolet LED 25 are connected to the lead frames 22a and 22b, through wires 26a and 26b, respectively. In addition, there is provided a wavelength-conversion part 29 installed inside the cup-shaped structure having the LED 25 therein. The wavelength-conversion part 29 includes the white light emitting phosphor blend and curing resin. For the curing resin, epoxy resin, silicon resin or silicon epoxy mixed resin can be used.

In the meantime, the white light emitting device 30 shown in FIG. 3b includes a substrate 31 wrapped around by two lead frames 32a and 32b. A near ultraviolet LED 35 is disposed on the substrate 31, and two electrodes (not shown) of the near ultraviolet LED 35 are connected to the lead frames 32a and 32b through wires 36a and 36b, respectively. In addition, a wavelength-conversion part 39 which surrounds the LED 35 contains the white light emitting phosphor blend. The wavelength-conversion part 39 is formed by appropriately mixing the white light emitting phosphor blend with epoxy resin, silicon resin and silicon epoxy mixed resin. In addition, the wavelength-conversion part 39 can be conveniently formed via molding process such as transfer molding as generally known to a person of ordinary skill in the art.

The near ultraviolet LEDs 25 and 35 may be LEDS emitting wavelength light of 300 to 450 nm. The wavelength-conversion parts 29 and 39 can convert the near ultraviolet rays emitted from the LEDs 25 and 35 into white light having superior color rendition quality and subdued yellowing phenomenon with the white light emitting phosphor blend described above.

Now, the operations and effects of the present invention will be described through specific examples.

Example 1

This example was conducted to confirm the chromaticity coordinate range that can be achieved with the phosphor blend for wavelength conversion according to the present invention.

First, blue, green, and red phosphors, $(Sr, Ca)_5(PO_4)_3Cl:Eu^{2+}$, $(Ba, Sr)_2SiO_4:Eu$, and $(Sr, Ca)S:Eu$ were prepared to produce the phosphor blend for wavelength conversion to be used in this example.

For each phosphor powder, the chromaticity of the light converted from the near ultraviolet rays of 405 nm was measured and the corresponding coordinates were marked in the CIE chromaticity diagram. The resulting chromaticity coordinates of each sample are as shown in the Table 2 and in the chromaticity diagram in FIG. 4.

TABLE 1

|  | X | Y |
| --- | --- | --- |
| $(Sr,Ca)_5(PO_4)_3Cl:Eu^{2+}$ | 0.15 | 0.03 |
| $(Ba,Sr)_2SiO_4:Eu$ | 0.19 | 0.63 |
| $(Sr,Ca)S:Eu$ | 0.62 | 0.37 |

Figure 4:
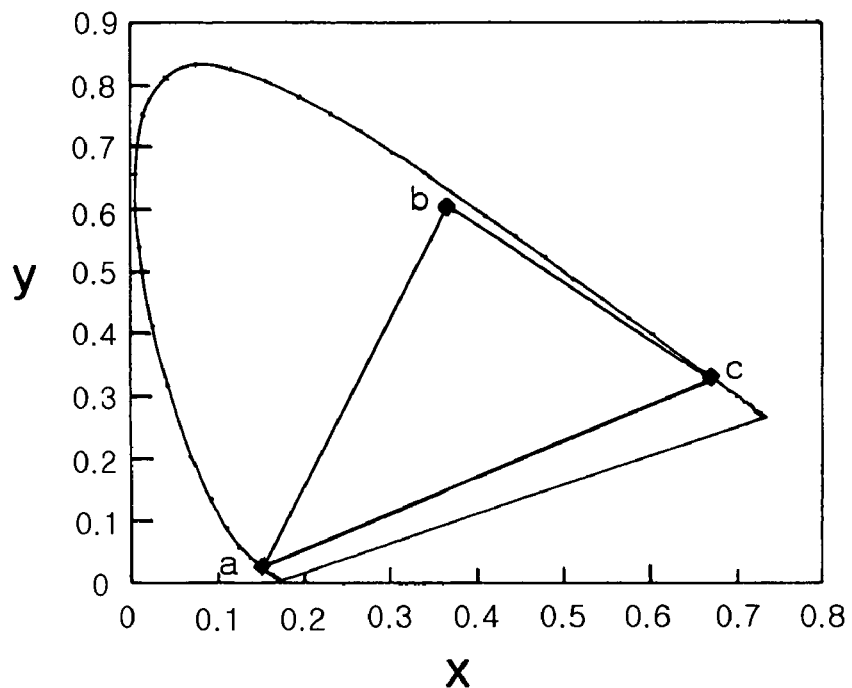
FIG. 4 is a chromaticity diagram showing a color range realizable with phosphor blend according to an embodiment of the present invention.

Referring to FIG. 4 with the Table 1, the phosphor for wavelength-conversion can be defined as being positioned within a triangular area having the coordinates (0.15, 0.03), (0.19, 0.33) and (0.62, 0.37) in the CIE chromaticity diagram. As indicated above, it is confirmed that the phosphor for wavelength-conversion can achieve at an appropriate composition the chromaticity in a broad distribution that cannot be achieved by the conventional phosphor.

Example 2

This example was conducted to confirm chromaticity and white light characteristics (yellowing and CRI) of the white light emitting phosphor blend according to the present invention.

First, as in the first example, blue, green, and red phosphors, $(Sr, Ca)_5(PO_4)_3Cl:Eu^{2+}$, $(Ba, Sr)_2SiO_4: Eu$, and $(Sr, Ca):Eu$ were prepared to produce the white light emitting phosphor blend to be used in this example.

In order to find out the range of color that can be achieved by the combination of the phosphors, the following seven samples were prepared as in the Table 2 below.

TABLE 2

|  | $(Sr,Ca)_5(PO_4)_3Cl:Eu^{2+}$ (wt %) | $(Ba,Sr)_2SiO_4:Eu$ (wt %) | $(Sr,Ca):Eu$ (wt %) |
| --- | --- | --- | --- |
| Sample 1 | 70.59 | 23.04 | 6.37 |
| Sample 2 | 65.98 | 30.44 | 3.58 |
| Sample 3 | 64.45 | 29.73 | 5.82 |
| Sample 4 | 80.08 | 15.60 | 4.32 |
| Sample 5 | 76.47 | 21.06 | 2.47 |
| Sample 6 | 78.32 | 18.30 | 3.38 |
| Comparative Sample 1 | 90.94 | 7.42 | 1.64 |

Using each phosphor blend fabricated by the compositions as in Table 2 and the same type of ultraviolet LED (about 405 nm), seven white light emitting devices (Samples 1 to 6, Comparative sample 1) having the structure shown in FIG. 3b were fabricated.

In the meantime, the yellow phosphor $Tb_3Al_5O_{12}$ and the blue LED (about 468 nm) were used to fabricate three white light emitting devices having different compositions of silicon resin and under the different conditions of manufacturing the package (Comparative samples 2 to 4), in accordance with the prior art.

Figure 5:
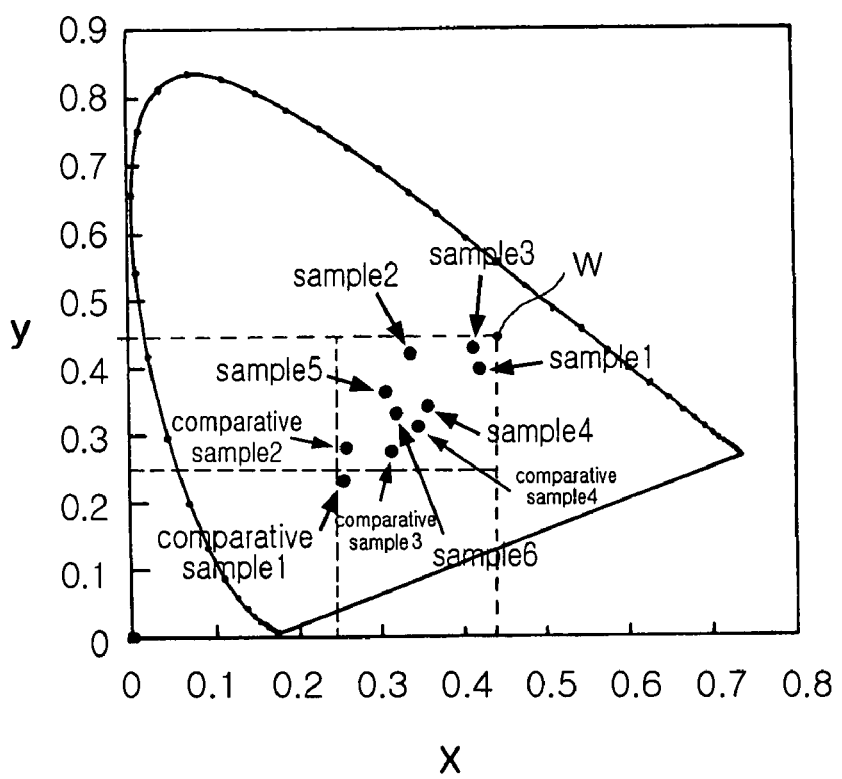
FIG. 5 is a chromaticity diagram showing a color range of white light emitting phosphor blend according to another embodiment of the present invention.

Next, the chromaticity of the light converted by each sample of white light emitting device was examined for each sample to measure the CRI for each sample. In addition, the same level of voltage was applied to emit light for 5 hours, and the occurrence of yellowing phenomenon was examined as the chromaticity changed. The results are shown in Table 3, and the corresponding color coordinates are marked in the chromaticity diagram shown in FIG. 5.

TABLE 3

|  | x | y | CRI |
| --- | --- | --- | --- |
| Sample 1 | 0.418 | 0.396 | 93.84 |
| Sample 2 | 0.337 | 0.419 | 80.59 |
| Sample 3 | 0.414 | 0.428 | 89.70 |
| Sample 4 | 0.357 | 0.341 | 94.43 |
| Sample 5 | 0.307 | 0.363 | 86.98 |
| Sample 6 | 0.320 | 0.331 | 95.00 |
| Comparative sample 1 | 0.254 | 0.232 | 78.62 |
| Comparative sample 2 | 0.282 | 0.264 | 72.51 |
| Comparative sample 3 | 0.302 | 0.295 | 76.44 |
| Comparative sample 4 | 0.333 | 0.327 | 77.82 |

As shown in Table 3, except for the Comparative sample 1, the Samples 1 to 6, and the Comparative samples 2 to 4 converted into output light positioned at a color coordinate (x, y) (dotted box designated by w in FIG. 5) where $0.25 \leq x \leq 0.45$ and $0.25 \leq y \leq 0.43$. That is, white light characteristics were weakened in the Comparative sample 1 with the composition of blue, green, and red phosphors which deviates from the appropriate composition.

Further, in terms of CRI which determines characteristics close to natural light, although the Comparison samples 2 to 4 exhibit white light, they exhibit low CRIs of about 72 to 78 which is the similar level to the Comparison sample 1, and exhibit a certain degree of yellowing as well. On the other hand, the Samples 1 to 6 exhibit CRIs of 80 or more, and the Samples 1, 4 and 6 exhibit CRIs of 90 or more. In addition, chromaticity-changing such as yellowing exhibited in the conventional TAG-based yellow phosphor was hardly observed in these samples.

Particularly, the Sample 6 exhibited a high level of CRI of 95%. The wavelength of white output light according to the Sample 6 is shown in FIG. 6.

Figure 1:
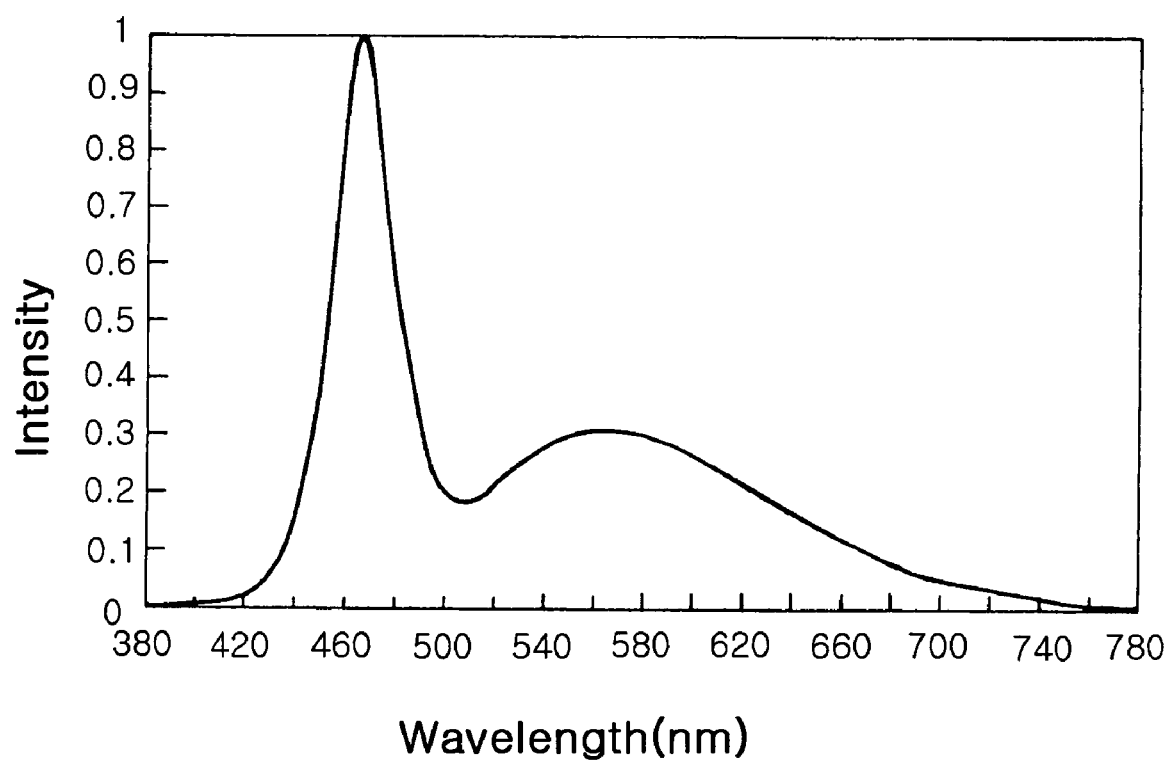
FIG. 1 is a graph showing a wavelength of light obtained from a conventional white light emitting device composed of a YAG:Ce phosphor and a blue LED.
Figure 6:
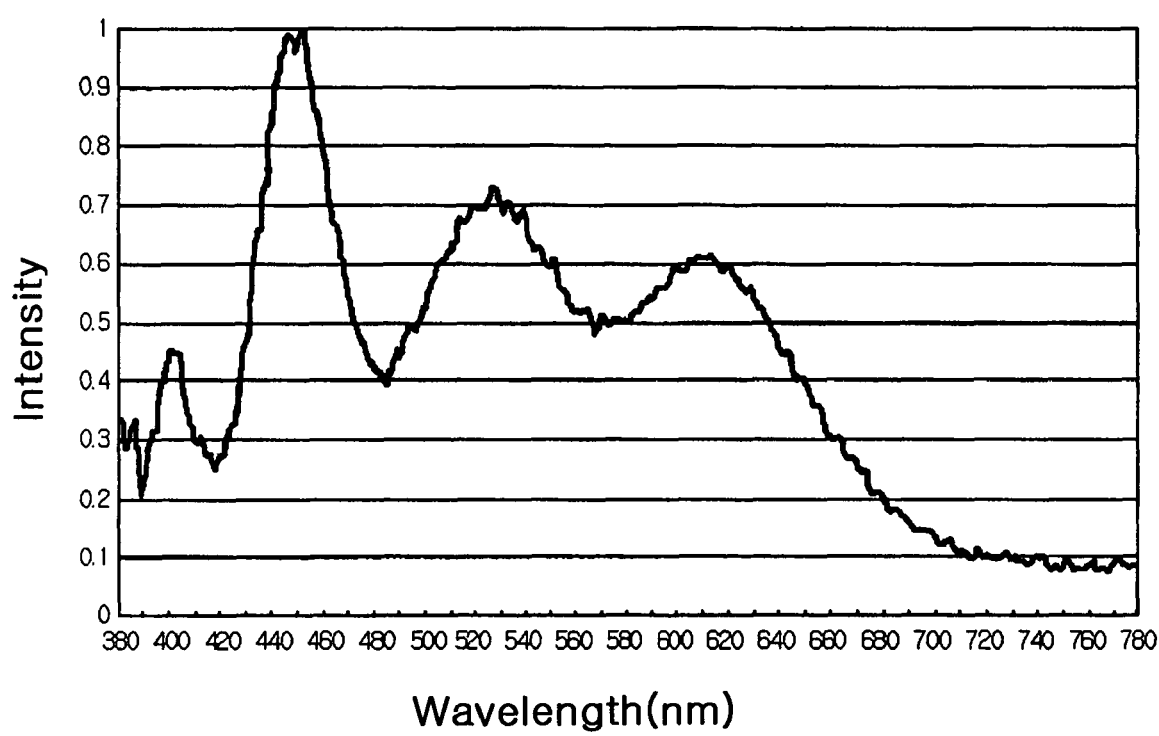
FIG. 6 is a graph showing a wavelength of white light converted from near ultraviolet radiation by white light emitting phosphor blend according to another embodiment of the present invention.

Referring to FIG. 6, the excited wavelength of light emitted is broadly and relatively evenly distributed in the entire region of the visible rays. Compared with the results of the conventional combination of the yellow phosphor (YAG-based) and the blue LED (refer to FIG. 1), considerable level of improvement is noticeable in the above wavelength distribution.

Based on the compositions of the samples in this embodiment, the appropriate composition of the white light emitting phosphor blend can be defined as below.

The preferable composition of the phosphor blend can be defined as in which $A_5(PO_4)_3Cl:Eu^{2+}$ is contained in an amount of 40 to 88 wt %, $D_2SiO_4:Eu$ is contained in an amount of 10 to 58 wt %, MS:Eu is contained in an amount of 2 to 50 wt %. The more preferable composition can be defined as in which $A_5(PO_4)_3Cl:Eu^{2+}$ is contained in an amount of 70 to 83 wt %, $D_2SiO_4$:Eu is contained in an amount of 13 to 27 wt %, and MS:Eu is contained in an amount of 3 to 7 wt %.

However, as described above, efficiency of a typical phosphor as well as external variables such as wavelength range and composition range of near ultraviolet radiation, and package structure should be taken into account, and thus the actual composition of the phosphor blend should be set more broadly.

According to the present invention set forth above, combination of specific blue, green, and red phosphors allows provision of phosphor blend for wavelength conversion capable of expressing a broader range of color. Further, white light emitting phosphor blend can be realized by the phosphors at an appropriate composition to minimize the occurrence of color changing phenomenon such as yellowing, thereby providing all natural white light having superior color rendering index (CRI) Moreover, the present invention provides a light emitting device capable of emitting superior-quality white light using the above-described white light emitting phosphor blend and the ultraviolet LED.

While the present invention has been shown and described in connection with the preferred embodiments, it will be apparent to those skilled in the art that modifications and variations can be made without departing from the spirit and scope of the invention as defined by the appended claims.

What is claimed is:

1. White light emitting phosphor blend comprising three phosphors, $A_5(PO_4)_3Cl:Eu^{2+}$, $D_2SiO_4$:Eu, and MS:Eu, wherein $A_5(PO_4)_3Cl:Eu^{2+}$ is contained in an amount of more than 70 up to 83 wt %, $D_2SiO_4$:Eu is contained in an amount of 13 to 27 wt %, and MS:Eu is contained in an amount of 3 to 7 wt %, wherein A comprises at least one of Sr, Ca, Ba, and Mg, D comprises at least one of Ba, Sr, and Ca, and M comprises at least one of Sr and Ca, wherein an output light has a color rendering index of 90 or more.

2. A white light emitting device comprising:
   a light emitting diode (LED) for emitting near ultraviolet radiation; and
   a wavelength converting part placed in the light emission direction of the LED and having white light emitting phosphor blend and curing resin wherein the white light emitting phosphor comprises three phosphors, $A_5(PO_4)_3Cl:Eu^{2+}$, $D_2SiO_4$:Eu, and MS:Eu, wherein $A_5(PO_4)_3Cl:Eu^{2+}$ is contained in an amount of more than 70 up to 83 wt %, $D_2SiO_4$:Eu is contained in an amount of 13 to 27 wt %, and MS:Eu is contained in an amount of 3 to 7 wt %, wherein A comprises at least one from Sr, Ca, Ba and Mg, D comprises Ba, Sr and Ca, and M comprises at least one of Sr and Ca, wherein an output light has a color rendering index of 90 or more.

3. The white light emitting device according to claim 2, wherein the near ultraviolet LED emits radiation having a wavelength of 300 to 450 nm.

4. The white light emitting device according to claim 2, wherein the curing resin comprises silicon or epoxy resin.

5. A white light emitting device comprising:
   a light emitting diode (LED) for emitting near ultraviolet radiation; and
   a wavelength converting part placed in the light emission direction of the LED and having white light emitting phosphor blend and curing resin wherein the white light emitting phosphor comprises three phosphors, $A_5(PO_4)_3Cl:Eu^{2+}$, $D_2SiO_4$:Eu, and MS:Eu, wherein $A_5(PO_4)_3Cl:Eu^{2+}$ is contained in an amount of more than 70 wt %, $D_2SiO_4$:Eu is contained in an amount of 13 to 27 wt %, and MS:Eu is contained in an amount of 3 to 7 wt %, wherein A comprises at least one from Sr, Ca, Ba and Mg, D comprises Ba, Sr and Ca, and M comprises at least one of Sr and Ca, wherein an output light has a color rendering index of 90 or more.

6. The white light emitting device according to claim 5, wherein the near ultraviolet LED emits radiation having a wavelength of 300 to 450 nm.

7. The white light emitting device according to claim 5, wherein the curing resin comprises silicon or epoxy resin.

* * * * *